(12) United States Patent
Yang et al.

(10) Patent No.: US 9,144,901 B2
(45) Date of Patent: Sep. 29, 2015

(54) STORAGE DEVICE FOR MULTILAYER SUBSTRATE

(76) Inventors: Weibing Yang, Shenzhen (CN);
Chunhao Wu, Shenzhen (CN);
Kunhsien Lin, Shenzhen (CN);
Yongqiang Wang, Shenzhen (CN);
Zhiyou Shu, Shenzhen (CN); Minghu Qi, Shenzhen (CN); Zenghong Chen, Shenzhen (CN); Zhenhua Guo, Shenzhen (CN); Yunshao Jiang, Shenzhen (CN)

( * ) Notice: Subject to any disclaimer, the term of this patent is extended or adjusted under 35 U.S.C. 154(b) by 421 days.

(21) Appl. No.: 13/638,028

(22) PCT Filed: Aug. 27, 2012

(86) PCT No.: PCT/CN2012/080613
§ 371 (c)(1),
(2), (4) Date: Sep. 28, 2012

(87) PCT Pub. No.: WO2014/023048
PCT Pub. Date: Feb. 13, 2014

(65) Prior Publication Data
US 2014/0042111 A1    Feb. 13, 2014

(30) Foreign Application Priority Data

Aug. 8, 2012  (CN) .......................... 2012 1 0279992

(51) Int. Cl.
*A47G 19/08*  (2006.01)
*B25H 3/00*  (2006.01)
(Continued)

(52) U.S. Cl.
CPC ................ *B25H 3/00* (2013.01); *H01L 21/673* (2013.01); *H01L 21/67303* (2013.01); *H01L 21/67346* (2013.01); *H01L 21/67751* (2013.01)

(58) Field of Classification Search
CPC .............. B25H 3/00; B65G 1/04; B65G 1/06; B65G 1/07; B65G 49/06; B65G 1/10; B65G 1/026; B65D 85/48; B65D 21/02; B25J 15/00; G02F 1/13; G02F 1/1333; Y10S 414/137; G01R 31/26; H01L 21/68; H01L 21/00; H01L 21/677; H01L 21/683; H01L 21/67109; H01L 21/68742; H01L 21/673; H01L 21/66; H01L 21/22; H01L 21/31; H01L 21/324; H01L 21/67309; H01L 21/67303; H01L 21/6734; H01L 21/67346; H01L 21/68707; H01L 21/67712; H01L 21/67739; H01L 21/67748; H01L 21/67763; H01L 21/67778; H01L 21/681; H01L 21/6875; H01L 21/6779; H01L 21/67766; H01L 21/67; H01L 21/67005; H01L 21/67751; H01L 21/67784; A47B 1/06
USPC ......... 211/41.14, 41.18, 1.57, 195, 175, 59.3; 206/710, 454, 832; 414/935
See application file for complete search history.

(56) References Cited

U.S. PATENT DOCUMENTS 3,331,337 A * 7/1967 Mackay ........................ 108/136
3,511,548 A * 5/1970 McIlhone ....................... 312/71
(Continued)

FOREIGN PATENT DOCUMENTS

CN      1750219 A    3/2006
CN      1810609 A    8/2006
(Continued)

OTHER PUBLICATIONS
Liu Yali, the International Searching Authority written comments, May 2013, CN.

*Primary Examiner* — Jennifer E Novosad

(57) ABSTRACT

A storage device for a multilayer substrate comprises a base, a support and multiple brackets. The brackets are stacked along the support and are slidably attached to the support. The storage device for the multilayer substrate further comprises a bracket moving device, and the bracket moving device drives one or more the brackets to move up and down along the support.

8 Claims, 4 Drawing Sheets

(51) Int. Cl.
*H01L 21/677* (2006.01)
*H01L 21/673* (2006.01)

(56) References Cited

U.S. PATENT DOCUMENTS

| | | | |
|---|---|---|---|
| 6,139,239 A | 10/2000 | Snijders | |
| 6,347,713 B1 * | 2/2002 | Piazza | 211/1.57 |
| 6,523,701 B1 * | 2/2003 | Yoshida et al. | 211/41.18 |
| 6,854,604 B2 * | 2/2005 | Soehnlen et al. | 211/1.57 |
| 7,694,690 B2 * | 4/2010 | Yen | 134/134 |
| 7,876,575 B2 * | 1/2011 | Hosokawa | 361/797 |
| 7,931,145 B2 * | 4/2011 | Gao et al. | 206/454 |
| 8,157,108 B1 * | 4/2012 | Waldrop | 211/1.57 |
| 2002/0113027 A1 * | 8/2002 | Minami et al. | 211/41.18 |
| 2003/0121870 A1 * | 7/2003 | Beckhart et al. | 211/41.18 |
| 2005/0041325 A1 * | 2/2005 | Chuang et al. | 360/92 |
| 2006/0032826 A1 | 2/2006 | Liu | |
| 2006/0060495 A1 * | 3/2006 | Chen et al. | 206/711 |
| 2014/0042111 A1 * | 2/2014 | Yang et al. | 211/41.14 |

FOREIGN PATENT DOCUMENTS

| | | |
|---|---|---|
| CN | 201247360 Y | 5/2009 |
| CN | 101584530 A | 11/2009 |
| CN | 101659346 A | 3/2010 |
| CN | 101746587 A | 6/2010 |
| CN | 101989563 A | 3/2011 |
| CN | 102101570 A | 6/2011 |
| JP | H08333008 A | 12/1996 |
| JP | H0943310 A | 2/1997 |
| JP | 2003188225 A | 7/2003 |
| JP | 2004186249 A | 7/2004 |
| JP | 2005311038 A | 11/2005 |
| JP | 2010098048 A | 4/2010 |
| KR | 20080001220 A | 1/2008 |
| KR | 20080062398 A | 7/2008 |

* cited by examiner

STORAGE DEVICE FOR MULTILAYER SUBSTRATE

TECHNICAL FIELD

The present disclosure relates to the field of manufacturing liquid crystal display (LCD) products, and more particularly to a storage device for a multilayer substrate.

BACKGROUND

An assembly line of a liquid crystal display (LCD) panel may have many manufacturing procedures, and also may have many types of production equipment, Because some of the production equipment may produce defective products, normal equipment still may not stop producing, so a temporary storage area is positioned between procedures. Semi-finished products in the assembly line of the LCD panel are mainly substrates. FIG. 1 shows a storage device for a multilayer substrate in the prior art. The storage device for the multilayer substrate includes a base 1, a support 2, and brackets 3. The support 2 and the brackets 3 are fixed together. Because a distance between adjacent brackets 3 is great, a sufficient space is reserved for a manipulator to take and put substrates, so that the number of stored substrates is small in a limited height of a factory. For example, in a factory with a 6-meter high ceiling, if the distance between the adjacent brackets 3 is twenty centimeters, only thirty substrates 5 may be placed at most. Space utilization is low, and sometimes even two storage devices for the multilayer substrates 5 are positioned in parallel in the temporary storage area. Furthermore, because the distance between the adjacent brackets 3 is as small as much as possible, the manipulator should control its speed, and take and put away substrates 5 carefully. Thus, storage efficiency is low.

SUMMARY

In view of the above-described problems, an aim of the present disclosure is to provide a storage device for a multilayer substrate capable of storing more substrates with high speed and efficiency of taking and putting substrates.

The first technical scheme of the present disclosure is that: a storage device for a multilayer substrate comprises a base, a support and multiple brackets. The brackets are stacked along the support and are slidably attached to the support. The storage device for the multilayer substrate further comprises a bracket moving device, and the bracket moving device drives the brackets to move up and down along the support. The bracket moving device comprises a lead screw, an actuating motor and a clamping structure arranged on the lead screw, and the clamping structure is used for clamping brackets. The actuating motor drives the lead screw to rotate, and rotation of the lead screw drives the clamping structure to move up and down along the lead screw. The clamping structure comprises an U-shaped bracket, two holding arms and a pull rod. Middle sections of the two holding arms are fixed on a corresponding end of the U-shaped bracket, and inner ends of the two holding arms are both connected with the pull rod so that when the pull rod is pulled to move, the two holding arms hold together. The pull rod is connected with a telescopic cylinder or a linear motor. The telescopic cylinder or the linear motor drives the pull rod to move axially. The actuating motor is fixed on the base. One end of the lead screw is fixed on the base, and another end of the lead screw is fixed on the support. Two sides of the support are correspondingly configured with two groups of the bracket moving devices respectively. The support is an optic axis. The brackets are configured with guide sleeves which are matched with the support, and the guide sleeves slide up and down along the support.

The second technical scheme of the present disclosure is that: a storage device for a multilayer substrate comprises a base, a support and multiple brackets. The brackets are stacked along the support and are slidably attached to the support. The storage device for the multilayer substrate further comprises a bracket moving device, and the bracket moving device drives one or more of the brackets to move up and down along the support.

In one example, the bracket moving device comprises a lead screws, an actuating motor and a clamping structure arranged on the lead screw, and the clamping structure is used for clamping brackets. The actuating motor drives the lead screw to rotate, and the rotation of the lead screw drives the clamping structure to move up and down along the lead screw. The lead screw rotates smoothly and lifts forcefully by using the actuating motor to match the lead screw, so that the brackets and the substrate may go up and down smoothly. Thus, adverse influence of vibration on the substrate is effectively avoided.

In one example, the clamping structure comprises a U-shaped bracket, two holding arms and a pull rod. Middle sections of the two holding arms are fixed on a corresponding end of the U-shaped bracket, and inner ends of the two holding arms are both connected with the pull rod so that when the pull rod is pulled to move, the two holding arms hold together.

In one example, the pull rod is connected with a telescopic cylinder or a linear motor. The telescopic cylinder or the linear motor drives the pull rod to move axially.

In one example, the clamping structure comprises an upper clamping structure and lower clamping structure. Thus, the manipulator may take two substrates one time, thereby improving efficiency of taking and putting.

In one example, the actuating motor is fixed on the base. One end of the lead screw is fixed on the base, and another end of the lead screw is fixed on the support.

In one example, two sides of the support are correspondingly configured with two groups of the bracket moving devices respectively. When the two groups of the bracket moving devices work simultaneously, a balanced lift force is applied to the brackets. Thus, sliding friction between the brackets and the support is effectively reduced.

In one example, the clamping structure of each bracket moving device comprises the upper clamping structure and the lower clamping structure.

In one example, the support is an optic axis. The brackets are configured with guide sleeves which are matched with the support, and the guide sleeves slide up and down along the support. Thus, the sliding friction between the brackets and the support is further reduced.

In one example, a spacer is further arranged between the brackets, and the spacer is used for adjusting the distance between the brackets. The spacer is sleeved on the support to adapt different working environment, so as to improve generality of the brackets.

The present disclosure has the advantages that: the brackets and support of the storage device for the multilayer substrate of the present disclosure are not fixed together, but in slidably attached, namely, the brackets are slidably attached to the support. The brackets are stacked along the support, and the space needs not to be reserved for the manipulator as long as the substrates may be taken and put in the distance between the brackets. Thus, more substrates may be contained in the space with the same height. When the substrates are taken and put, the bracket moving device specially designed in the present disclosure may lift one or more of the brackets to provide the space for the manipulator to freely get in or out. At the moment, the brackets may be lifted slightly higher to provide a larger moving space for the manipulator, so that we may not worry about that the manipulator may bump into nearby objects. Thus, the taking and putting speed of the manipulator may be increased, thereby improving efficiency. When taking out and putting in the substrates is completed, the distance between the brackets is restored by using the bracket moving device, and ready for next taking and putting substrates procedure.

DETAILED DESCRIPTION

Figure 1:
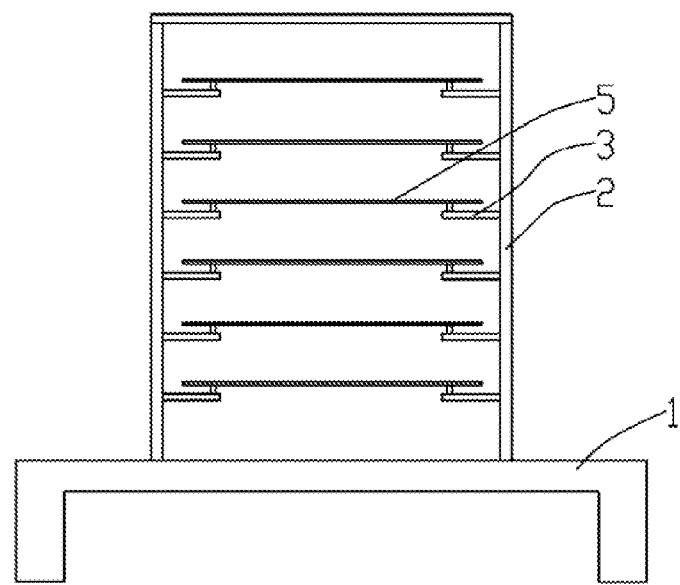
FIG. 1 is a structure schematic diagram of a storage device for a multilayer substrate in the prior art.
Figure 2:
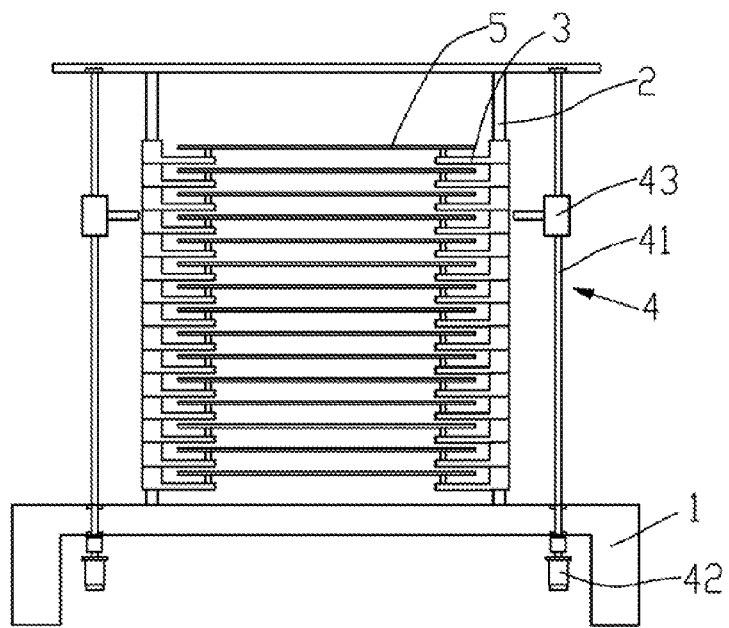
FIG. 2 is a structure schematic diagram of a storage device for a multilayer substrate of a first example of the present disclosure.
Figure 3:
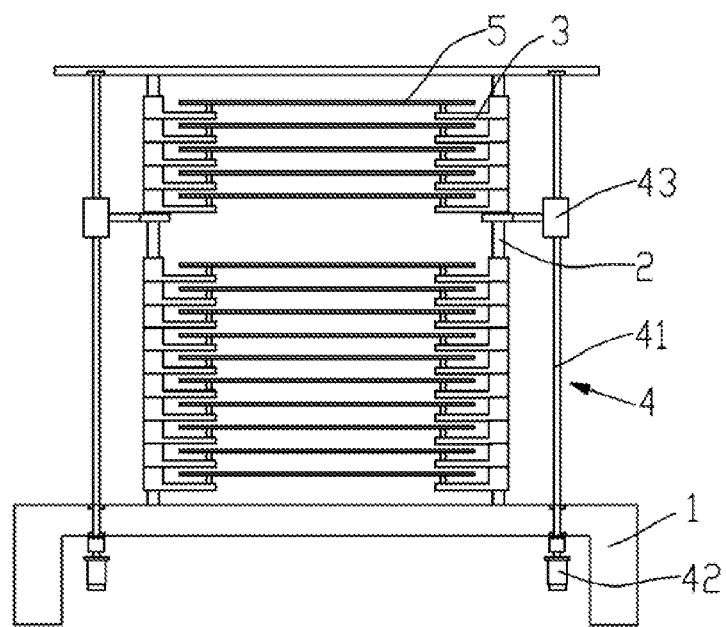
FIG. 3 is a schematic diagram of a storage device for a multilayer substrate in a state of taking and putting a substrate of a first example of the present disclosure.

The present disclosure discloses a storage device for a multilayer substrate. FIG. 2 to FIG. 5 show a first example of the present disclosure, where the storage device for the multilayer substrate comprises a base 1, a support 2, and multiple brackets 3. The brackets 3 are stacked along the support and are slidably attached to the support 2. The storage device for the multilayer substrate further comprises a bracket moving device 4, where the bracket moving device drives one or more of the brackets move up and down along on the support.

The brackets 3 and support 2 of the storage device for the multilayer substrate of the present disclosure are not fixed together, but are slidably attached, namely, the brackets 3 are slidably attached to the support 2. The brackets 3 are stacked along the support, and a space for a manipulator is not required as long as the substrates may be taken and put in a distance between the brackets 3. Thus, more substrates may be contained in the space having a same height. For example, in a factory with a 6-meter high ceiling, if the distance between the adjacent brackets 3 is twenty-five millimeters and a space of thirty centimeters is reserved for the manipulator, two-hundred substrates may be placed. Space utilization is high. When the substrates 5 are taken out and put back in, the bracket moving device 4 specially designed in the present disclosure may lift one or more of the brackets 3 to provide the space for the manipulator to freely get in or out. At the moment, the brackets 3 may be lifted slightly higher to provide a larger moving space for the manipulator, so that the manipulator may not bump into nearby objects. Thus, taking and putting speed of the manipulator may be increased, thereby improving efficiency. When taking out and putting in the substrates 5 is completed, the distance between the brackets 3 is restored by using the bracket moving device 4, and ready for a next taking and putting substrates procedure.

In the example, the bracket moving, device 4 comprises a lead screw 41, an actuating motor 42, and a clamping structure 43 arranged on the lead screw 41, where the clamping structure 43 is used for clamping brackets 3. The actuating motor 42 drives the lead screw 41 to rotate, and rotation of the lead screw 41 drives the clamping structure 43 to move up and down along the lead screw 41. The bracket moving device 4 adopts the way that the actuating motor 42 to match the lead screw 41, so that the lead screw 41 rotates smoothly and lifts forcefully, and then the brackets 3 and the substrate 5 can go up and down smoothly. Thus, adverse influence of vibration on the substrate 5 is effectively avoided.

In the example, the actuating motor 42 is fixed on the base 1. One end of the lead screw 41 is fixed on the base 1, and another end of the lead screw 41 is fixed on the support 2. Two sides of the support 2 are correspondingly configured with two groups of the bracket moving devices 4 respectively. When the two groups of the bracket moving devices 4 work simultaneously, a balanced lift force is applied to the brackets 3. Thus, sliding friction between the brackets 3 and the support 2 is effectively reduced. Additionally, an optic axis is adopted to manufacture the support 2, and the brackets 3 are configured with guide sleeves 31 which are matched with the support. The guide sleeves 31 slide up and down along the support 2. Thus, the sliding friction between the brackets 3 and the support 2 is further reduced.

Figure 4:
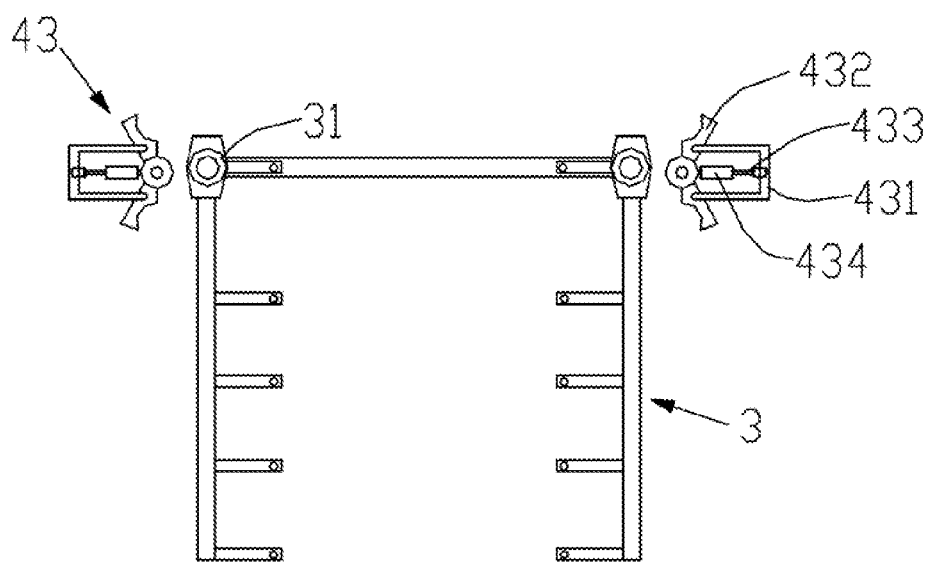
FIG. 4 is a top view of a bracket and a clamping structure of a storage device for a multilayer substrate of a first example of the present disclosure.
Figure 5:
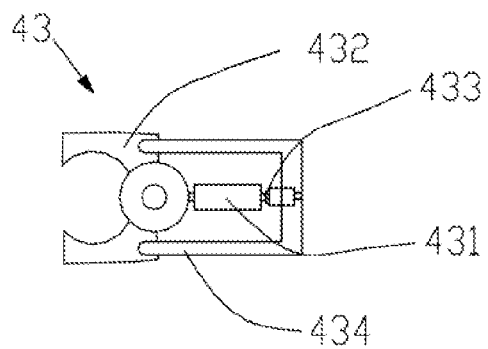
FIG. 5 is a schematic diagram of a clamping structure in a clamping state of a storage device for a multilayer substrate of a first example of the present disclosure.

In the example, as shown in FIG. 4, the clamping structure 43 comprises an U-shaped bracket 431, two holding arms 432, and a pull rod 433. Middle sections of the two holding arms 432 are fixed on a corresponding end of the U-shaped bracket 431, and inner ends of the two holding arms 432 are both connected with the pull rod 433 such that when the pull rod 433 is pulled to move, the two holding arms 432 hold together. The pull rod 433 is connected with a telescopic cylinder 434. The telescopic cylinder 434 drives the pull rod 433 to move axially. When the clamping structure 43 is not in a clamping state, clamping structure 43 may freely slide up and down, and may not bump into the substrates 5 and brackets 3. As shown in FIG. 5, when the clamping structure 43 moves to an appropriate height, the telescopic cylinder 434 acts to make the clamping structure 43 in a clamping state, and then the two holding arms 432 hold the brackets. When the lead screw drives the clamping structure 43 to rise, the brackets 3 are lifted. When the brackets 3 are restored to an original position, the telescopic cylinder acts reversely to make the two holding arms open in a standby state. The clamping structure of the present disclosure is safe and reliable.

In the example, the telescopic cylinder may be replaced by a linear motor. Similarly, the linear motor may drive the pull rod to move axially, and the same beneficial effect is achieved.

Figure 6:
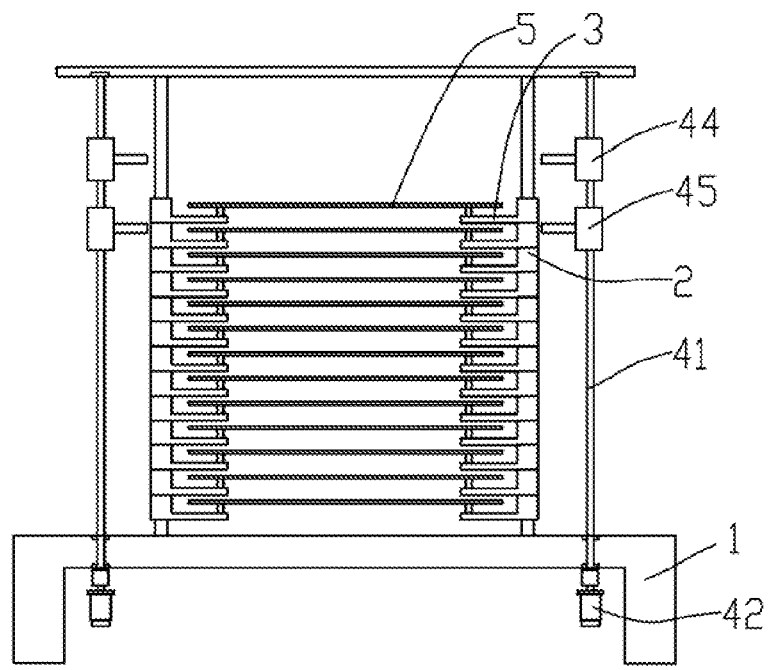
FIG. 6 is a structure schematic diagram of a storage device for a multilayer substrate of a second example of the present disclosure.
Figure 7:
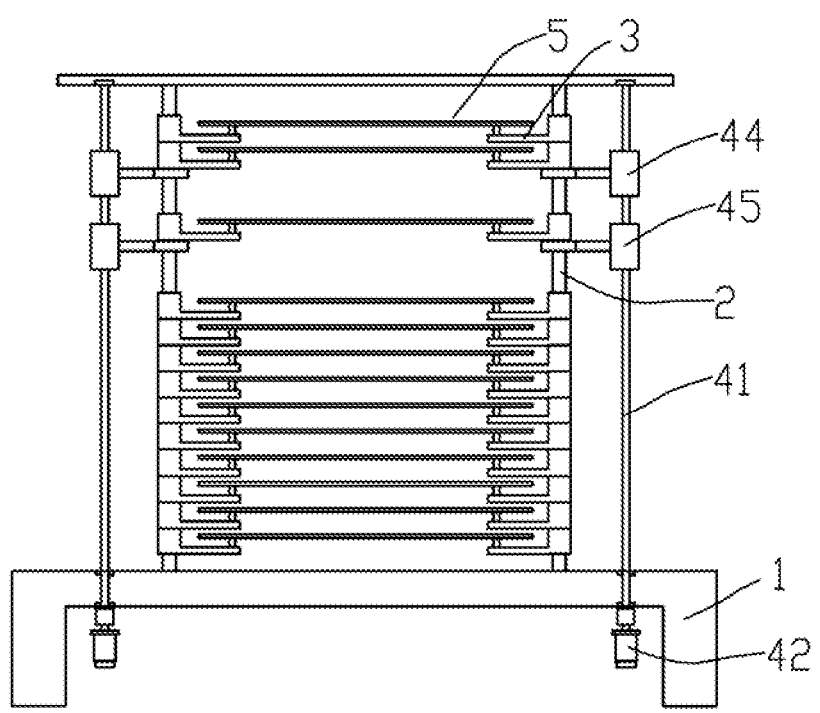
FIG. 7 is a schematic diagram of a storage device for a multilayer substrate in a state of taking and putting a substrate of a second example of the present disclosure.

FIG. 6 and FIG. 7 show a second example of the storage device for the multilayer substrate of the present disclosure. The example still comprises two groups of bracket moving devices, but difference from the first example is that the clamping structure comprises an upper clamping structure 44 and a lower clamping structure 45. The storage device for the multilayer substrate of the present disclosure may make the manipulator take two substrates 5 at one time.

Firstly, the actuating motor is started to lift the upper clamping structure to the preset height, then the upper clamping structure 44 clamps, and then the upper clamping structure is lifted again. Meanwhile, the upper clamping structure 44 drives one or more of the brackets 3 to lift. Then, the lower clamping structure is lifted to the preset height, and the lower clamping structure 45 clamps. Finally, the lower clamping structure 45 is lifted again, and at the same time the lower clamping structure 45 also drives one or more of the brackets 3 to lift. At the moment, the storage device for multilayer substrate may have the operation space for two manipulators. Thus, taking two substrates 5 at one time is achieved, and efficiency of taking and putting is improved.

In the present invention, because thickness of the substrates 5 may be different, and action accuracy of the manipulator may also be inconsistent, the distance between the brackets 3 is needed to be adjusted to adapt to specific working environments. In the present disclosure, a spacer that is used for adjusting the distance between the brackets is arranged between the brackets 3. The spacer is sleeved on the support. Thus, generality of the brackets is improved.

The present disclosure is described in detail in accordance with the above contents with the specific preferred embodiments. However, this present disclosure is not limited to the specific embodiments. For the ordinary technical personnel of the technical field of the present disclosure, on the premise of keeping the conception of the present disclosure, the technical personnel may also make simple deductions or replacements, and all of which should be considered to belong to the protection scope of the present disclosure.

We claim:

1. A storage device for a multilayer substrate, comprising:
a base;
a support;
multiple brackets; and
two bracket moving devices;
wherein the brackets are stacked along the support and are slidably attached to the support;
wherein the two bracket moving devices drives one or more of the brackets to move up and down along, the support;
wherein each of the two bracket moving device comprises a lead screw, an actuating motor, and a clamping structurearranged on the lead screw, wherein the clamping structure is used for clamping the brackets;
wherein the actuating motor drives the lead screw to rotate, and rotation of the lead screw drives the clamping structure to move up and down along the lead screw;
wherein the clamping structure comprises a U-shaped bracket, two holding arms, and a pull rod;
wherein middle sections of the two holding arms are fixed on a corresponding end of the U-shaped bracket, and inner ends of the two holding arms are both connected with the pull rod such that when the pull rod is pulled to move, the holding arms hold together;
wherein the pull rod is connected with a telescopic cylinder or a linear motor, and the telescopic cylinder or the linear motor drives the pull rod to move axially;
wherein the actuating motor is fixed on the base, one end of the lead screw is fixed on the base, and another end of the lead screw is fixed on the support;
wherein two sides of the support are correspondingly equipped with the two bracket moving devices respectively; and
wherein the support is an optic axis; the brackets are configured with guide sleeves, and the guide sleeves are matched with the support, and slide along the support.

2. A storage device for the multilayer substrate comprising:
a base;
a support;
multiple brackets; and
a bracket moving device;
wherein the brackets are stacked along the support and are slidably attached to the support; and
wherein the bracket moving device drives one or more of the brackets to move up and down along the support, wherein the bracket moving device comprises a lead screw, an actuating motor, and a clamping structure arranged on the lead screw, wherein the clamping structure is used for clamping the brackets and wherein the actuating motor drives the lead screw to rotate, and rotation of the lead screw drives the clamping structure to move up and down along the lead screw.

3. The storage device for the multilayer substrate of claim 2, wherein the clamping structure comprises an U-shaped bracket, two holding arms, and a pull rod; middle sections of the two holding arms are fixed on a corresponding end of the U-shaped bracket, and inner ends of the two holding arms are both connected with the pull rod so that when the pull rod is pulled to move, the two holding arms hold together.

4. The storage device for the multilayer substrate of claim 3, wherein the pull rod is connected with a telescopic cylinder or a linear motor, and the telescopic cylinder or the linear motor drives the pull rod to move axially.

5. The storage device for the multilayer substrate of claim 3, wherein the clamping structure comprises an upper clamping structure and a lower clamping structure.

6. The storage device for the multilayer substrate of claim 2, wherein the actuating motor is fixed on the base, one end of the lead screw is fixed on the base, and another end of the lead screw is fixed on the support.

7. The storage device for the multilayer substrate of claim 2, wherein two sides of the support are correspondingly equipped with the two bracket moving devices respectively.

8. The storage device for the multilayer substrate of claim 7, wherein the clamping structure of each group of the bracket moving device comprises an upper clamping structure and a lower clamping structure.

* * * * *